(12) United States Patent
Matsushita

(10) Patent No.: US 6,906,492 B2
(45) Date of Patent: Jun. 14, 2005

(54) MOTOR ABNORMALITY DETECTION APPARATUS AND ELECTRIC POWER STEERING CONTROL SYSTEM

(75) Inventor: Masaki Matsushita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 99 days.

(21) Appl. No.: 10/299,710

(22) Filed: Nov. 20, 2002

(65) Prior Publication Data

US 2003/0222612 A1 Dec. 4, 2003

(30) Foreign Application Priority Data

May 28, 2002 (JP) .................................. 2002-153828

(51) Int. Cl.[7] .............................. H02P 3/18; H02P 5/28; H02P 7/36
(52) U.S. Cl. .................. 318/727; 318/806; 318/138; 318/434; 318/432; 180/410; 180/443
(58) Field of Search ............................ 318/254, 256, 318/280, 287, 293, 139, 430, 722, 727, 800, 803, 806, 807, 808, 609, 610, 432, 433; 180/410, 443, 444, 446, 6.44, 6.48, 6.5; 701/41–43

(56) References Cited

U.S. PATENT DOCUMENTS

| | | | | |
|---|---|---|---|---|
| 5,602,451 A | * | 2/1997 | Kohge et al. | 318/293 |
| 5,740,880 A | * | 4/1998 | Miller | 180/446 |
| 5,973,463 A | * | 10/1999 | Okuda et al. | 318/430 |
| 6,081,093 A | * | 6/2000 | Oguro et al. | 318/807 |
| 6,198,256 B1 | * | 3/2001 | Miyazaki et al. | 322/16 |
| 6,281,656 B1 | * | 8/2001 | Masaki et al. | 318/700 |
| 6,338,015 B1 | * | 1/2002 | Kawagoe et al. | 701/41 |
| 6,344,725 B2 | * | 2/2002 | Kaitani et al. | 318/700 |
| 6,427,104 B1 | * | 7/2002 | Matsushita et al. | 701/41 |
| 6,427,105 B1 | * | 7/2002 | Matsushita | 701/41 |
| 6,504,336 B2 | * | 1/2003 | Sakamaki | 318/727 |
| 6,577,957 B2 | * | 6/2003 | Fujimoto et al. | 702/36 |
| 6,608,456 B2 | * | 8/2003 | Imai et al. | 318/254 |
| 6,608,457 B2 | * | 8/2003 | Kogiso | 318/432 |
| 6,639,379 B2 | * | 10/2003 | Matsushita et al. | 318/727 |
| 6,687,590 B2 | * | 2/2004 | Kifuku et al. | 701/43 |
| 6,696,807 B2 | * | 2/2004 | Iwata et al. | 318/432 |
| 6,700,343 B2 | * | 3/2004 | Masaki et al. | 318/434 |
| 2003/0121716 A1 | * | 7/2003 | Yamada et al. | 180/446 |

FOREIGN PATENT DOCUMENTS

| | | |
|---|---|---|
| JP | 09-266693 A | 10/1997 |
| JP | 2000-184772 | 6/2000 |
| JP | 2000-228891 A | 8/2000 |

* cited by examiner

Primary Examiner—David Martin
Assistant Examiner—Eduardo Colon Santana
(74) Attorney, Agent, or Firm—Sughrue Mion, PLLC

(57) ABSTRACT

A motor abnormality detection apparatus is capable of performing the abnormality detection of a motor (5) without supplying a special electric current thereto for abnormality detection in an ordinary control state. A motor control device (100) controls the motor (5) through vector control which is described by a two-phase rotating magnetic flux coordinate system having the direction of a field current as a d-axis direction and a direction orthogonal to the d-axis direction as a q-axis direction. A motor abnormality detection part (100h) (100h) performs an abnormality determination of the motor based on target impression voltages (Vd*, Vq*) impressed on the motor (5).

41 Claims, 12 Drawing Sheets

FIG. 3
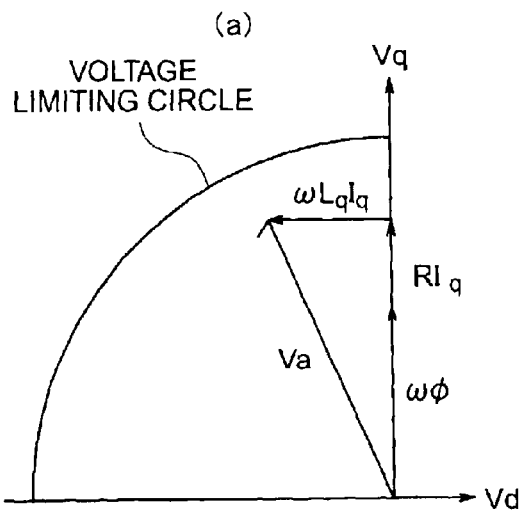
(a)
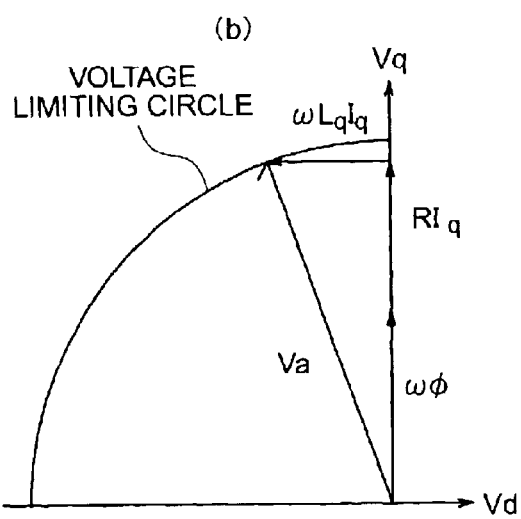
(b)
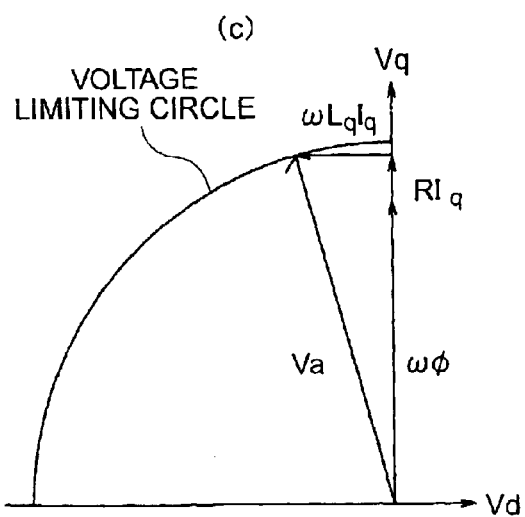
(c)

MOTOR ABNORMALITY DETECTION APPARATUS AND ELECTRIC POWER STEERING CONTROL SYSTEM

BACKGROUND OF THE INVENTION

1. Field of the Invention

The present invention relates to a motor abnormality detection apparatus used for abnormality detection of a brushless motor and an electric power steering control system equipped with such a motor abnormality detection apparatus.

2. Description of the Related Art

Conventionally, brushless motors are used in electric power steering systems or the like. In such electric power steering systems or the like, it is necessary to always perform the detection of faults or failures such as a break or disconnection of a motor power line, etc., in order to prevent abnormality in steering assist torque, i.e., the output torque of a brushless motor.

In general, a brushless motor control apparatus performs arithmetic calculations such as the calculation of d-axis and q-axis (hereinafter called "dq-axis") target currents based on a command torque, the detection of motor currents of respective phases (for instance, u phase, v phase and w phase), the dq conversion (hereinafter called "uvw to dq transformation") of currents, the calculation of current deviations, the calculation of command voltage values, dq inversion (hereinafter called "dq to uvw transformation"), and PWM control pattern outputs. The respective detected phase currents are converted or transformed from three phases into two phases (i.e., dq conversion or uvw to dq transformation), and are subjected to feedback control so that their d-axis component and q-axis component become equal to a d-axis target current and a q-axis target current, respectively.

Here, note that the d-axis component of a current means a reactive or wattless current. When the motor is a synchronous motor with a constant magnitude of excitation magnetic field, the q-axis component of a current supplied to the motor is proportional to the torque of the motor. Therefore, in the current feedback control, in case of the synchronous motor, it is generally controlled such that the d-axis component of the detected current becomes zero and the q-axis component becomes equal to a target value of the output torque.

For instance, in an apparatus disclosed in Japanese patent application laid-open No. 2000-184772, abnormality determination is performed by supplying a current to the d axis of a brushless motor.

In this apparatus, however, operation efficiency reduces due to the fact that a d-axis current, which is usually controlled to be zero, is supplied to the motor in order to detect abnormality or fault in the motor. On the other hand, if abnormality detection processing is carried out at constant time intervals to avoid the reduction in efficiency, there will be generated a delay in abnormality detection.

SUMMARY OF THE INVENTION

The present invention is intended to obviate the problems as referred to above, and has for its object to provide a motor abnormality detection apparatus and an electric power steering control system equipped with such a motor abnormality detection apparatus in which abnormality in a motor can be detected under an ordinary control state without supplying a special current to the motor for abnormality detection.

Bearing the above object in mind, the present invention resides in a motor abnormality detection apparatus in which a motor is controlled through vector control which is described by a two-phase rotating magnetic flux coordinate system having the direction of a field current as a d-axis direction and a direction orthogonal to the d-axis direction as a q-axis direction. The apparatus includes an abnormality detection part for making a determination of abnormality in said motor based on target impression voltages impressed on said motor. According to the present invention, it is possible to carry out the detection of abnormality in the motor in an ordinary control state. In addition, it is possible to provide an electric power steering control system equipped with such a motor abnormality detection apparatus which is capable of detecting abnormality in a motor which generates an assist force for power steering under an ordinary control state without the need of supplying a current to the motor for the purpose of abnormality detection.

The above and other objects, features and advantages of the present invention will become more readily apparent to those skilled in the art from the following detailed description of preferred embodiments of the present invention taken in conjunction with the accompanying drawings.

BRIEF DESCRIPTION OF THE DRAWINGS

FIG. 3 is a vector diagram used for explaining the operation of the brushless motor according to the first embodiment of the present invention.

DESCRIPTION OF THE PREFERRED EMBODIMENTS

Hereinafter, preferred embodiments of the present invention will be described in detail while referring to the accompanying drawings.

Embodiment 1.

Figure 1:
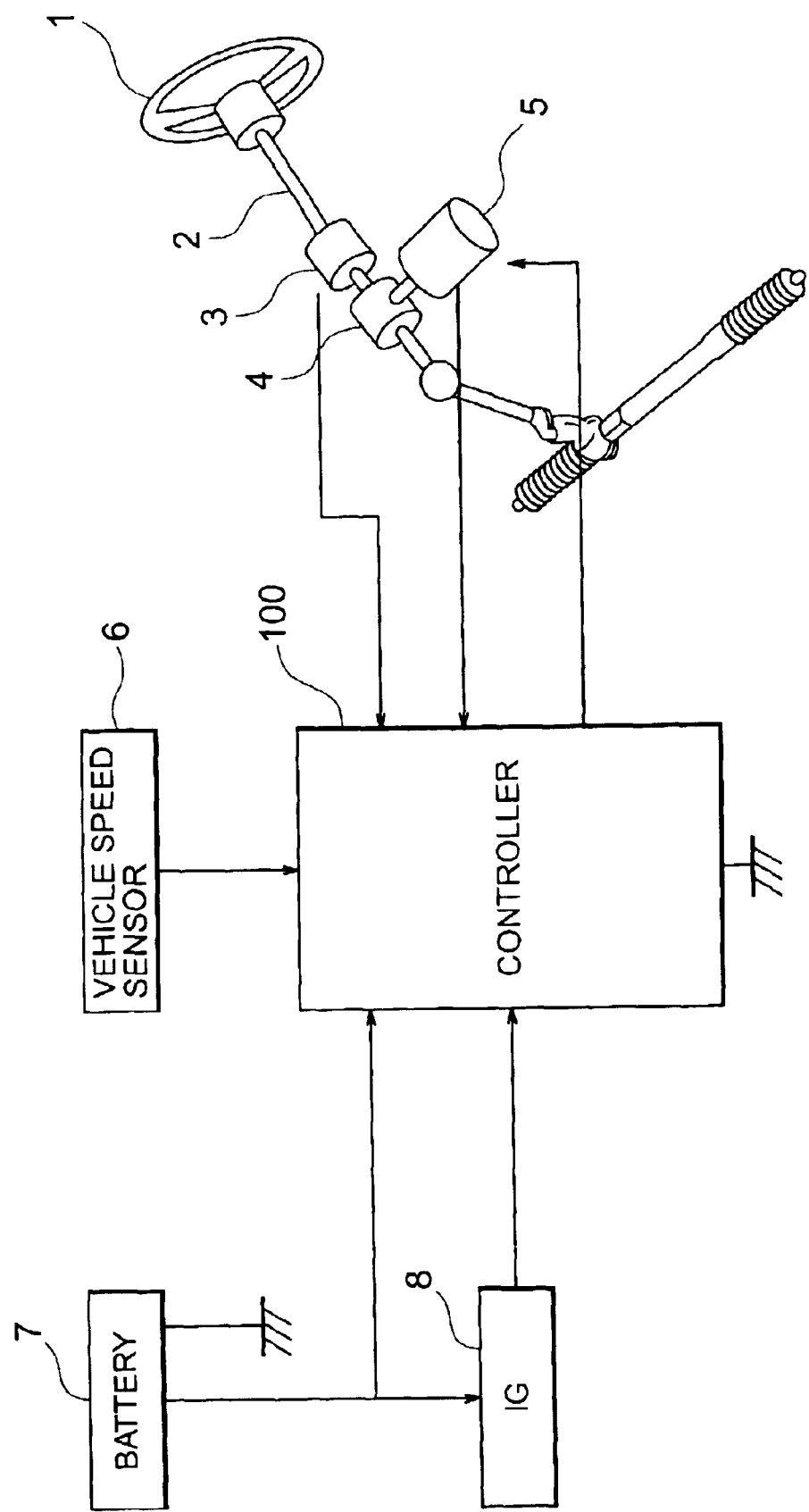
FIG. 1 is a view illustrating the construction of an electric power steering control system equipped with a motor abnormality detection apparatus in accordance with a first embodiment of the present invention.

Now, a first embodiment of the present invention will be described below in detail with particular reference to FIGS. 1 through 4. FIG. 1 is a view illustrating the construction of an electric power steering system to which a motor abnormality detection apparatus in accordance with a first embodiment of the present invention is applied. As shown in FIG. 1, a motor 5 for generating steering assist torque is connected through a speed reduction gear 4 with one end of a steering shaft 2 which is connected at the other end thereof with a steering wheel 1. Also, connected with the steering shaft 2 is a torque sensor 3 for detecting the steering torque of the steering wheel 1 and generating an output signal representative of the detected torque value.

A controller 100 determines a steering assist torque based on the steering torque of the steering wheel 1 detected by the torque sensor 3 and the speed of a vehicle detected by a vehicle speed sensor 6, and serves to assist the steering operation of the steering wheel 1 by driving the motor 5 to generate the steering assist torque thus determined. Note that in FIG. 1, reference numerals 7 and 8 designate a battery and an ignition switch, respectively.

Figure 2:
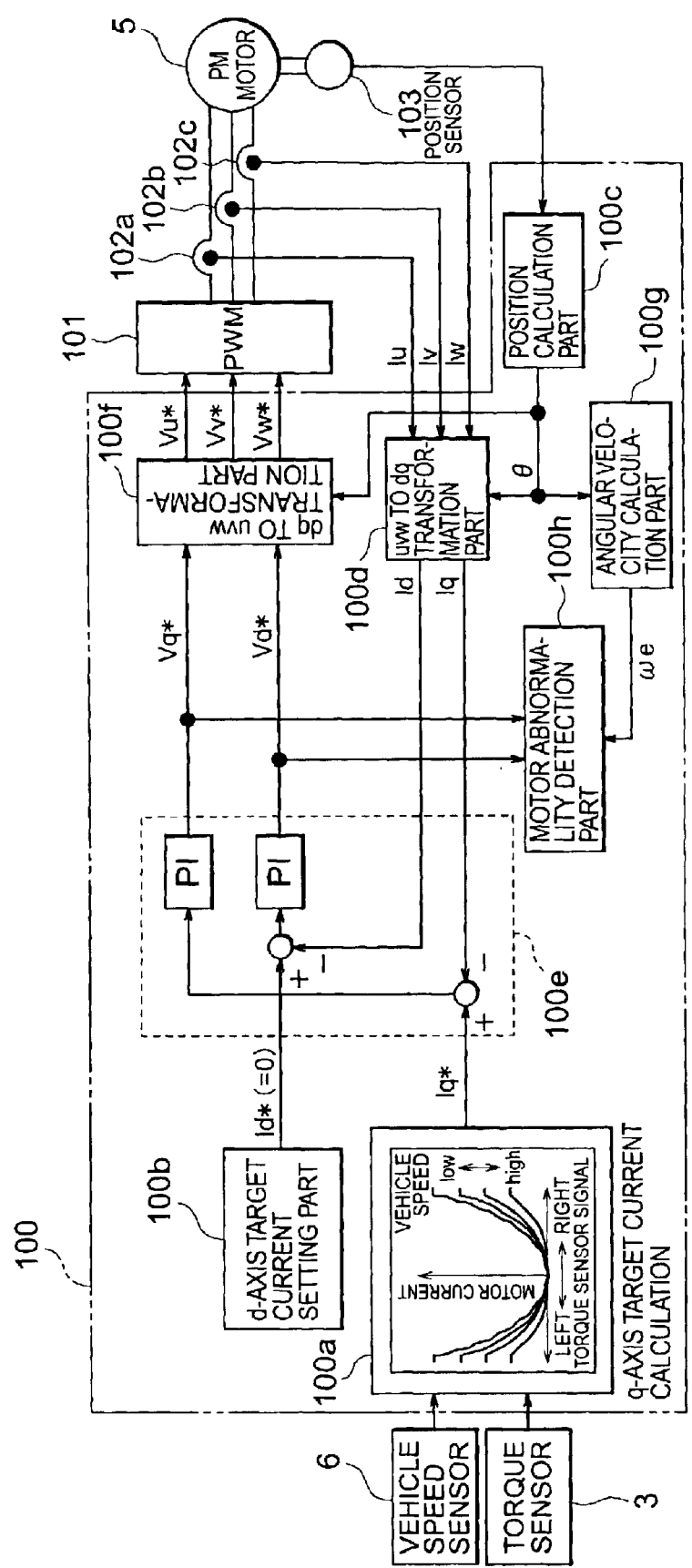
FIG. 2 is a control block diagram functionally illustrating an example of the electric power steering control system using a permanent magnet brushless motor (hereinafter called a PM brushless motor) as a steering assist motor according to the first embodiment of the present invention.

FIG. 2 functionally illustrates an example of a control block diagram of an electric power steering control system using a permanent magnet brushless motor (hereinafter called a PM brushless motor) as a steering assist motor according to the first embodiment. In FIG. 2, a reference numeral 100 designates a microcomputer corresponding to the controller 100 shown in FIG. 1 for performing steering assist control, and a software configuration of the microcomputer 100 is illustrated therein as various functional blocks. In FIG. 2, the microcomputer 100 includes a q-axis target current calculation part 100a, a d-axis target current setting part 100b, a position calculation part 100c, a dq conversion (or uvw to dq transformation) part 100d, a current control part 100e, a dq inversion (or dq to uvw transformation) part 100f, an angular velocity calculation part 100g, and a motor abnormality detection part 100h.

The q-axis target current calculation part 100a performs predetermined calculations based on the torque detection signal of the torque sensor 3, which detects the steering torque of the steering wheel 1, and the vehicle speed detection signal of the vehicle speed sensor 6, which detects the vehicle speed, determines a q-axis target current value Iq* for driving the PM brushless motor 5, and supplies the q-axis target current value Iq* thus determined to the current control part 100e.

The d-axis target current setting part 100b supplies a d-axis target current Id to the current control part 100e as a zero current.

The position calculation part 100c determines an electrical angle θ through calculations based on the positional detection signal of a position sensor 103 representative of the rotational position of the PM brushless motor 5, and supplies the electrical angle θ thus determined to the angular velocity calculation part 100g, the uvw to dq transformation part 100d and the dq to uvw transformation part 100f.

The angular velocity calculation part 100g determines a motor electrical angular velocity $\omega_e$ through calculations based on the electrical angle θ, and supplies it to the motor abnormality detection part 100h.

The uvw to dq transformation part 100d performs three-phase to two-phase transformation (dq conversion or uvw to dq transformation) based on three-phase current values (Iu, Iv, Iw) detected by current sensors 102a, 102b and 102c and the electrical angle θ by using the following expression (1), and supplies d-axis and q-axis (dq-axis) currents (Id, Iq) thus obtained to the current control part 100e.

$$\begin{bmatrix} Id \\ Iq \end{bmatrix} = \sqrt{\frac{2}{3}} \begin{bmatrix} \cos\theta & \cos\left(\theta - \frac{2}{3}\pi\right) & \cos\left(\theta + \frac{2}{3}\pi\right) \\ -\sin\theta & -\sin\left(\theta - \frac{2}{3}\pi\right) & -\sin\left(\theta + \frac{2}{3}\pi\right) \end{bmatrix} \begin{bmatrix} Iu \\ Iv \\ Iw \end{bmatrix} \quad (1)$$

The current control part 100e performs proportional and integral (PI) control based on deviations between the dq-axis target currents (Id*, Iq*) and the corresponding detected dq-axis currents (Id, Iq), and generates dq-axis target impression voltages (Vd*, Vq*).

The dq to uvw transformation part 100f performs two-phase to three-phase transformation (dq inversion or dq to uvw transformation) based on the dq-axis target impression voltages (Vd*, Vq*) and the electrical angle θ by using the following expression (2) to generate three-phase target impression voltages (Vu*, Vv*, VW*), which are supplied to a drive part 101 in the form of a PWM actuator.

$$\begin{bmatrix} Vu^* \\ Vv^* \\ Vw^* \end{bmatrix} = \sqrt{\frac{2}{3}} \begin{bmatrix} 1 & 0 \\ -\frac{1}{2} & \frac{\sqrt{3}}{2} \\ -\frac{1}{2} & -\frac{\sqrt{3}}{2} \end{bmatrix} \begin{bmatrix} \cos\theta & -\sin\theta \\ \sin\theta & \cos\theta \end{bmatrix} \begin{bmatrix} Vd^* \\ Vq^* \end{bmatrix} \quad (2)$$

Next, a method for detecting abnormality in a motor according to this embodiment will be described below. A circuit equation (the following expression (3)) for the motor 5 represented by d-q coordinates is well-known.

$$\begin{bmatrix} Vd \\ Vq \end{bmatrix} = \begin{bmatrix} R + pL_d & -\omega_e L_q \\ \omega_e L_d & R + pL_q \end{bmatrix} \begin{bmatrix} I_d \\ I_q \end{bmatrix} + \begin{bmatrix} 0 \\ \omega_e \Phi_a \end{bmatrix} \quad (3)$$

where Vd represents a d-axis armature voltage; Vq represents a q-axis armature voltage; R represents an armature resistance; $\Phi_a$ represents $\sqrt{(3/2)} \cdot \Phi'_a$; $\Phi'_a$ represents an armature winding interlinkage magnetic flux maximum value; p represents a differential operator (d/dt); Id represents a d-axis armature current; Iq represents a q-axis armature current; $\omega_e$ represents an electrical angular velocity; Ld represents a d-axis inductance; and Lq represents a q-axis inductance.

Here, note that FIG. 3 is a vector diagram of expression (3) above. When the number of revolutions per minute of the motor is equal to or less than a prescribed value, a combined or synthesized voltage vector Va of the d-axis armature voltage Vd and the q-axis armature voltage Vq becomes an operating point in a voltage limiting circle, as shown in a vector diagram of FIG. 3A.

In addition, when the angular velocity of the motor increases from the state of FIG. 3A, the synthesized voltage vector Va becomes an operating point on the voltage limiting circle, as shown in a vector diagram of FIG. 3B.

Moreover, when the angular velocity of the motor further increases from the state of FIG. 3B, the q-axis current Iq decreases, i.e., the motor output torque decreases, and the synthesized voltage vector Va becomes an operating point on the voltage limiting circle, as shown in a vector diagram of FIG. 3C.

Since in the electric power steering control system, the motor 5 is directly connected with the steering wheel 1 through the speed reduction gear 4, the most part of rotation of the motor 5 is in a stopped state or a low-speed rotating state, and hence the synthesized voltage vector Va becomes an operating point within the voltage limiting circle. However, upon abrupt steering operation such as urgent avoidance operation, etc., the motor 5 is caused to rotate at a speed higher than an idling speed by means of an external force so that the synthesized voltage vector Va becomes an operating point on the voltage limiting circle.

Therefore, in the electric power steering control system, it is possible to perform accurate abnormality detection by making a determination as to whether the synthesized voltage vector Va of the d-axis armature voltage Vd and the q-axis armature voltage Vq becomes an operating point on the voltage limiting circle when the angular velocity of the motor is below a predetermined value.

Here, note that in the electric power steering control system, the rotation of the motor 5 is almost stopped or performed at a low speed, and hence even in cases where the system is constructed such that abnormality determination is made only below a predetermined angular velocity of the motor, it is possible to perform abnormality detection at all times under the ordinary steering condition except for abrupt steering operation such as urgent avoidance operation, etc.

In this first embodiment, abnormality determination is carried out based on whether the magnitude or length of the synthesized voltage vector Va is less than a predetermined voltage with the angular velocity of the motor being equal to a predetermined value or below.

Figure 4:
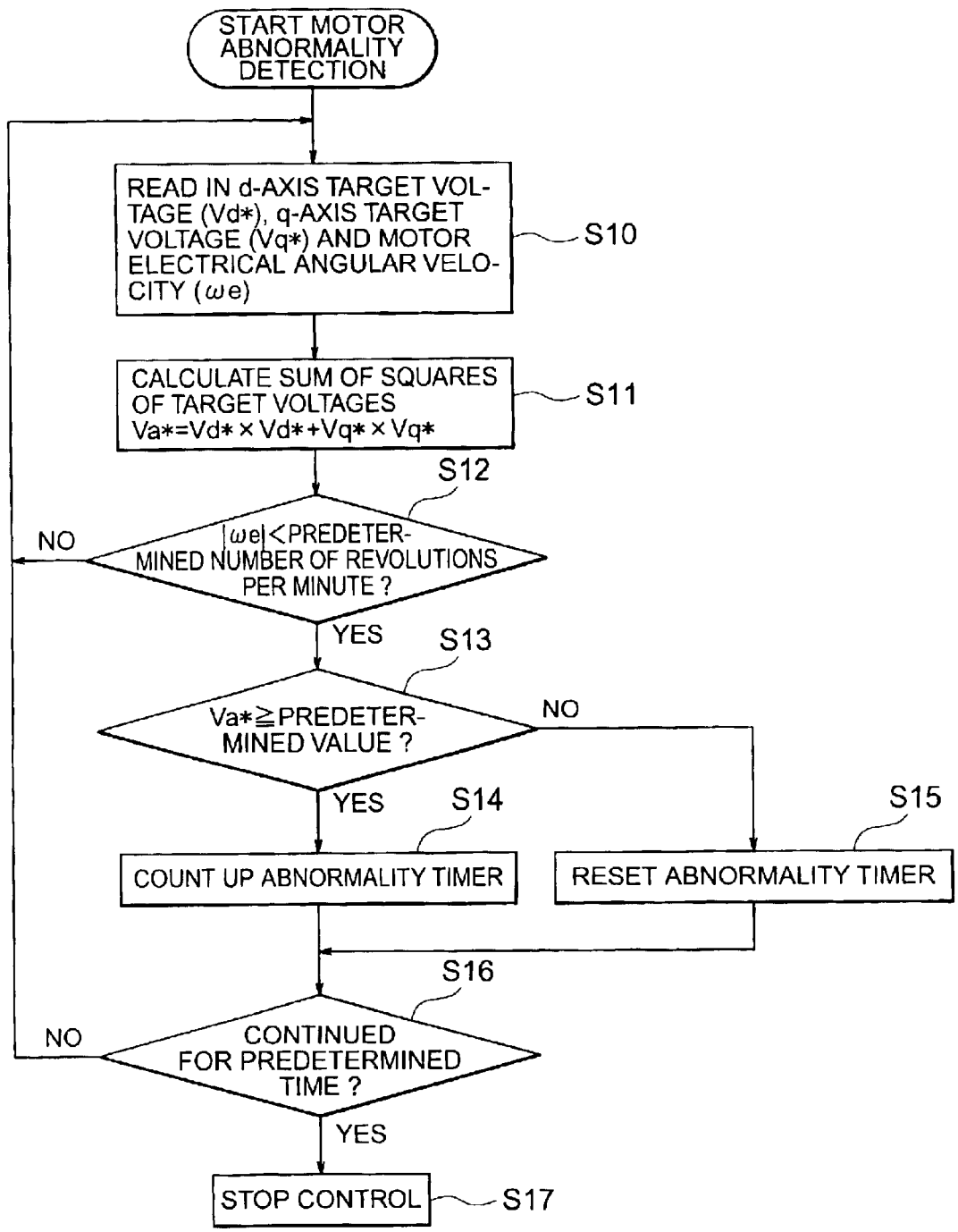
FIG. 4 is used to explain the operation of the first embodiment of the present invention, and is a flow chart explaining the processing performed by a motor abnormality detection part 100h of FIG. 2.

FIG. 4 is a flow chart explaining the processing performed by the motor abnormality detection part 100h. In step S10, the d-axis target voltage Vd* and the q-axis target voltage Vq* output from the current control part 100e and the motor electrical angular velocity $\omega_e$ output from the angular velocity calculation part 100g are read into the motor abnormality detection part 100h, and then the control flow advances to step S11. In step S11, the sum of squares Va* of the dq-axis target voltages is calculated by the motor abnormality detection part 100h through arithmetic calculations, and the control flow advances to step S12. In step S12, it is determined whether the motor electrical angular velocity $\omega_e$ is less than a predetermined number of revolutions per minute. When the motor electrical angular velocity $\omega_e$ is less than the predetermined number of revolutions per minute, the control flow advances to step S13, whereas when it is equal to or greater than the predetermined number of revolutions per minute, a return to step S10 is performed.

In step S13, it is determined whether the sum of squares Va* of the dq-axis target voltages is equal to or greater than a predetermined value. When the sum of squares Va* of the dq-axis target voltages is equal to or greater than the predetermined value, an abnormality timer is counted up in step S14, whereas when it is less than the predetermined value, the abnormality timer is reset in step S15.

Subsequently, in step S16, it is determined whether an abnormal state continues for a predetermined time, that is, the count value of the abnormality timer has reached a prescribed value. When the count value of the abnormality timer has not yet reached the prescribed value, a return to step S10 is carried out.

When it is determined in step S16, by repeating step S10 through step S16, that the abnormal state continues for the predetermined time, that is, the count value of the abnormality timer has reached the prescribed value, it is assumed that there is abnormality, and the control on the brushless motor 5 is stopped in step S17.

In the electric power steering control system as constructed above in which provision is made for the motor abnormality detection part 100h, abnormality such as a break of a motor power line, a failure of the drive part 101, failures of the current sensors 102a, 102b and 102c, etc., can be detected in the ordinary control state.

In addition, since abnormality determination is performed only below the predetermined motor electrical angular velocity, it is possible to prevent misjudgments even in cases where the dq-axis synthesized voltage vector Va can take an operating point on the voltage limiting circle in the normal operating condition as in the electric power steering control system.

Although the above-mentioned first embodiment is constructed such that a determination of abnormality is made when the sum of squares Va* of the dq-axis target voltages is equal to or greater than the predetermined value, abnormality in the motor may instead be determined when the synthesized voltage vector of the dq-axis target voltages becomes an operating point on the voltage limiting circle.

In the first embodiment, the detection of motor abnormality in the electric power steering control system has been described, but the present invention can also be used for the detection of abnormality in a motor used in systems or fields other than electric power steering control systems.

In addition, in cases where the present invention is used for detecting abnormality in a motor in a system in which the synthesized voltage vector of the dq-axis voltages can not become an operating point on the voltage limiting circle, it is possible to perform abnormality detection at all times irrespective of the angular velocity of the motor.

Embodiment 2.

Now, reference will be made to an electric power steering control system in accordance with a second embodiment of the present invention while referring to FIGS. 5 and 6 of the accompanying drawings. In the second embodiment, the motor abnormality detection part 100h performs a determination of abnormality in a motor based on the d-axis target voltage Vd* output from the current control part 100e.

Figure 5:
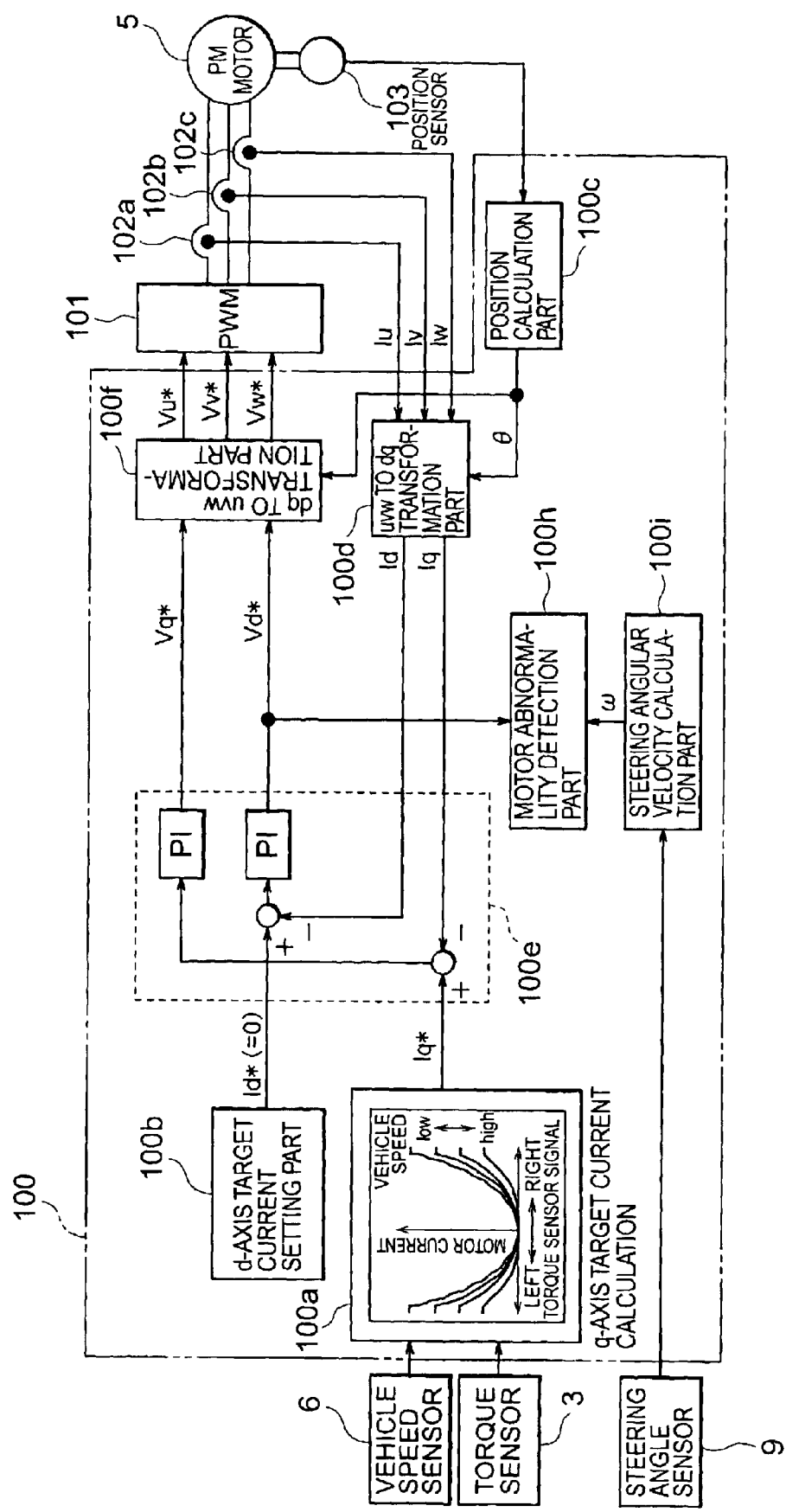
FIG. 5 is a view functionally illustrating an example of an electric power steering control system using a PM brushless motor as a steering assist motor according to a second embodiment of the present invention.

FIG. 5 functionally illustrates an example of an electric power steering control apparatus in which a PM brushless motor is used as a steering assist motor, in accordance with a second embodiment of the present invention. In FIG. 5, the same parts as those of the first embodiment shown in FIG. 2 are identified by the same symbols while omitting an explanation thereof. This second embodiment additionally includes, as new components, a steering angle sensor 9 for detecting the rotational angle of the steering wheel 1, and a steering angular velocity calculation part 100i for calculating a steering angular velocity $\omega$ (i.e., the angular velocity of the steering wheel 1) from the steering angle detected by the steering angle sensor 9, and supplying it to the motor abnormality detection part 100h.

Here, note that from expression (3) above, the d-axis armature voltage Vd when the d-axis armature current Id is controlled to zero (i.e., Id=0) is represented by the following expression (4).

$$V_d = -\omega_e \cdot L_q \cdot I_q \qquad (4)$$

Figure 6:
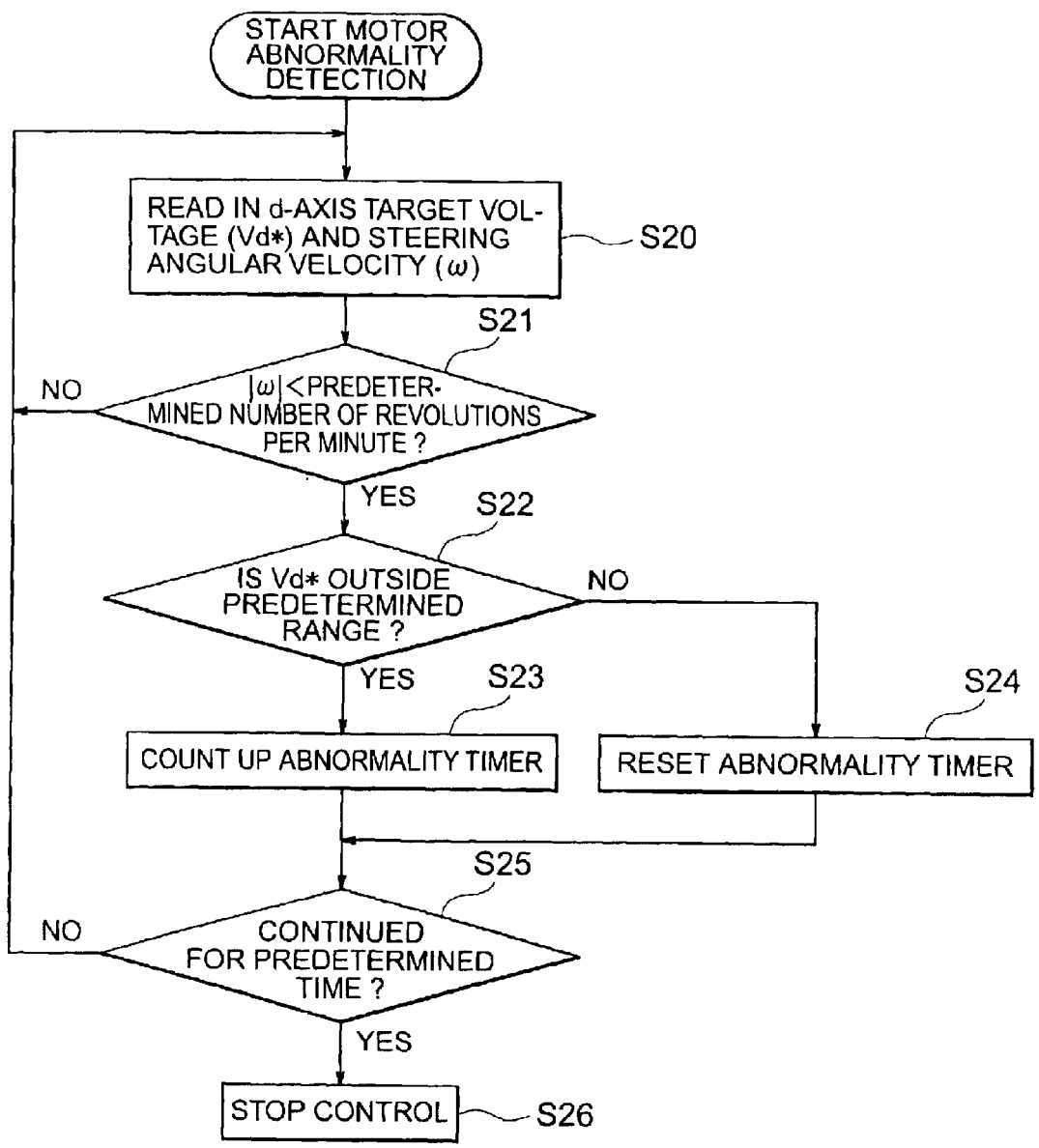
FIG. 6 is used to explain the operation of the second embodiment of the present invention, and is a flow chart explaining the processing performed by a motor abnormality detection part 100h of FIG. 5.

FIG. 6 is a flow chart explaining the processing performed by the motor abnormality detection part 100*h* according to the second embodiment. In step S20, the d-axis target voltage Vd* output from the current control part 100*e* and the steering angular velocity ω output from the steering angular velocity calculation part 100*i* are read into the motor abnormality detection part 100*h*, and then the control flow advances to step S21. In step S21, it is determined whether the steering angular velocity ω is less than a predetermined number of revolutions per minute. When the steering angular velocity ω is less than the predetermined number of revolutions per minute, the control flow advances to step S22, whereas when it is equal to or greater than the predetermined number of revolutions per minute, a return to step S20 is performed.

In step S22, it is determined whether the d-axis target voltage Vd* is outside a predetermined range. When the d-axis target voltage Vd* is outside the predetermined range, an abnormality timer is counted up in step S23, whereas when it is within the predetermined range, the abnormality timer is reset in step S24. Here, in order to prevent mis-detections, the above-mentioned predetermined range as set beforehand is set to be wider than a voltage range into which the d-axis armature voltage Vd, which is obtained from expression (4) above under the condition of the steering angular velocity ω being less than the above-mentioned predetermined number of revolutions pre minute, can fall.

Subsequently, in step S25, it is determined whether an abnormal state continues for a predetermined time, that is, the count value of the abnormality timer has reached a prescribed value. When the count value of the abnormality timer has not yet reached the prescribed value, a return to step S20 is carried out.

When it is determined in step S25, by repeating step S20 through step S25, that the abnormal state continues for the predetermined time, that is, the count value of the abnormality timer has reached the prescribed value, it is assumed that there is abnormality, and the control on the brushless motor 5 is stopped in step S26.

In the electric power steering control system as constructed above in which provision is made for the motor abnormality detection part 100*h*, abnormality such as a break of a motor power line, a failure of the drive part 101, failures of the current sensors 102*a*, 102*b* and 102*c*, etc., can be detected at all times.

Moreover, since abnormality determination is performed only below a predetermined steering angular velocity (i.e., the predetermined number of revolutions pre minute), it is possible to prevent mis-detections even in a special case where the motor 5 is caused to rotate at a speed higher than an idling speed by means of an external force as in the electric power steering control apparatus.

Although in the above-mentioned second embodiment, the processing of counting up the abnormality timer is performed when the d-axis target voltage Vd* is outside the predetermined range as set beforehand, the abnormality timer may instead be counted up when the d-axis target voltage Vd* is saturated or reached.

In this second embodiment, the detection of motor abnormality in the electric power steering control system has been described, but the present invention can also be used for the detection of abnormality in a motor used in systems or fields other than electric power steering control systems.
Embodiment 3.

Reference will be made to an electric power steering control system in accordance with a third embodiment of the present invention while referring to FIGS. 7 and 8 of the accompanying drawings. In the third embodiment, the motor abnormality detection part 100*h* determines that the motor 5 is abnormal when a deviation between the d-axis target voltage Vd* output from the current control part 100*e* and the d-axis armature voltage Vd obtained from the motor electrical angular velocity $\omega_e$ and the q-axis current Iq using expression (4) above is greater than a prescribed value.

Figure 7:
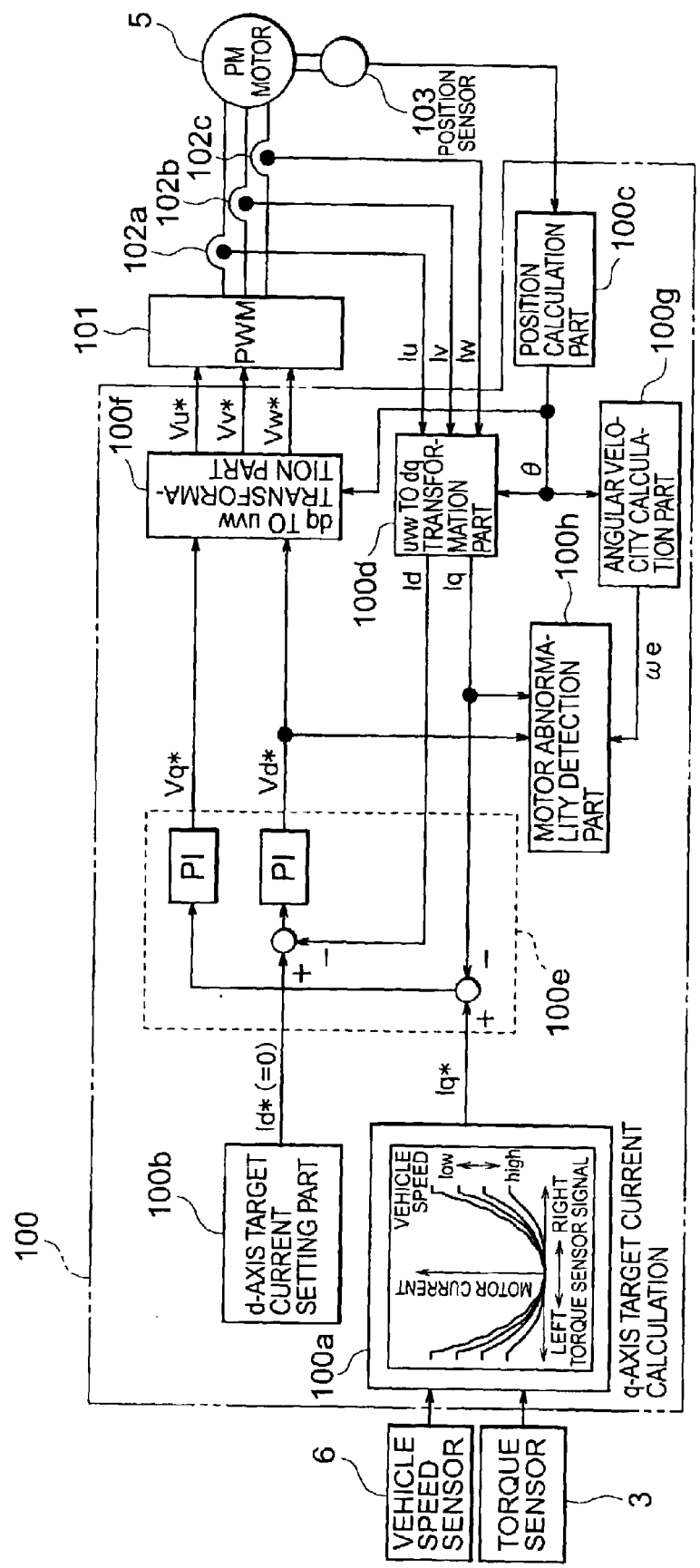
FIG. 7 is a view functionally illustrating an example of an electric power steering control system using a PM brushless motor as a steering assist motor according to a third embodiment of the present invention.

FIG. 7 functionally illustrates an example of the electric power steering control apparatus in which a PM brushless motor is used as a steering assist motor, in accordance with the third embodiment of the present invention.

Figure 8:
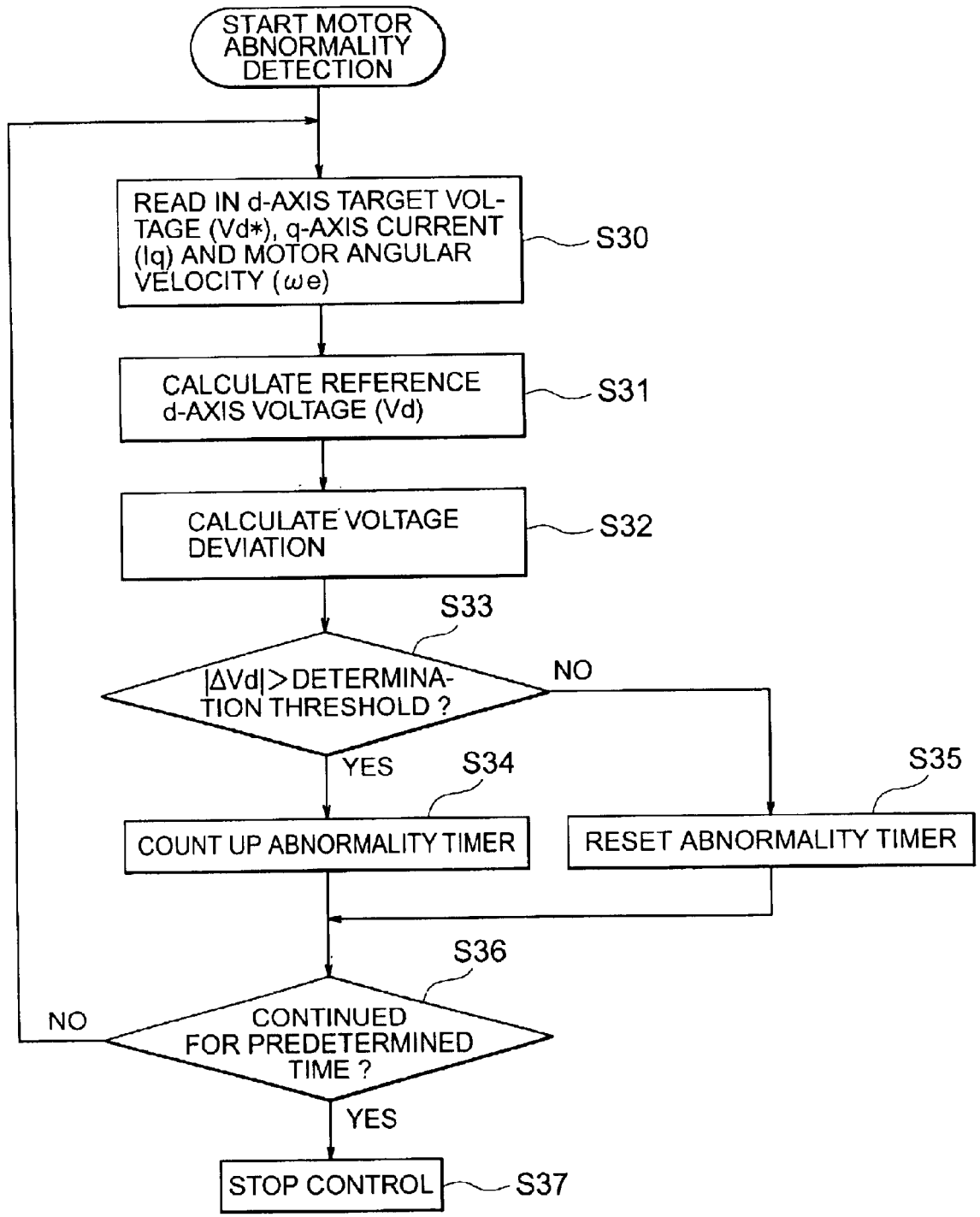
FIG. 8 is used to explain the operation of the third embodiment of the present invention, and is a flow chart explaining the processing performed by a motor abnormality detection part 100h of FIG. 7.

FIG. 8 is a flow chart explaining the processing performed by the motor abnormality detection part 100*h* of FIG. 7 according to the third embodiment. In step S30, the d-axis target voltage Vd* output from the current control part 100*e*, the motor electrical angular velocity $\omega_e$ output from the angular velocity calculation part 100*g* and the q-axis current Iq output from the uvw to dq transformation part 100*d* are read into the motor abnormality detection part 100*h*, and then the control flow advances to step S31.

In step S31, a d-axis armature voltage Vd that satisfies expression (4) is calculated by the motor abnormality detection part 100*h* through arithmetic calculations.

In step S32, a deviation ΔVd between the d-axis target voltage Vd* output from the current control part 100*e* and the d-axis armature voltage Vd obtained in step S31 is calculated.

In step S33, it is determined whether the absolute value |ΔVd| of the deviation ΔVd is greater than a determination threshold. When the absolute value |ΔVd| of the deviation ΔVd is greater than the determination threshold, an abnormality timer is counted up in step S34, whereas when it is equal to or less than the determination threshold, the abnormality timer is reset in step S35.

Subsequently, in step S36, it is determined whether an abnormal state continues for a predetermined time, that is, the count value of the abnormality timer has reached a prescribed value. When the count value of the abnormality timer has not yet reached the prescribed value, a return to step S30 is carried out.

When it is determined in step S36, by repeating step S30 through step S36, that the abnormal state continues for the predetermined time, that is, the count value of the abnormality timer has reached the prescribed value, it is assumed that there is abnormality, and the control on the brushless motor 5 is stopped in step S37.

In the electric power steering control system as constructed above in which provision is made for the motor abnormality detection part 100*h*, abnormality such as a break of a motor power line, a failure of the drive part 101, failures of the current sensors 102*a*, 102*b* and 102*c*, etc., can be detected at all times.

In the third embodiment, the detection of motor abnormality in the electric power steering control system has been described, but the present invention can also be used for the detection of abnormality in a motor used in systems or fields other than electric power steering control systems.

In the third embodiment, the motor abnormality detection part 100*h* determines that the motor 5 is abnormal when the deviation between the d-axis target voltage Vd* output from the current control part 100*e* and the d-axis armature voltage Vd obtained from expression (4) is greater than the prescribed value, but the d-axis armature voltage Vd as shown in the following expression (5) may be calculated while taking into consideration the d-axis armature current Id from expression (3) above, and a determination of abnormality in the motor 5 may be made when a deviation between the d-axis armature voltage Vd and the d-axis target voltage Vd* is greater than a prescribed value. This serves to make it possible to perform a more accurate abnormal determination.

$$V_d = R \cdot I_d - \omega_e \cdot L_q \cdot I_q \quad (5)$$

where R represents an armature resistance; Id represents a d-axis armature current; $\omega_e$ represents an electrical angular velocity; Lq represents a q-axis inductance; and Iq represents a q-axis armature current.

In this case, it is necessary to input the d-axis current Id from the uvw to dq transformation part 100d to the motor abnormality detection part 100h of FIG. 7.

Embodiment 4.

Reference will be made to an electric power steering control system in accordance with a fourth embodiment of the present invention while referring FIGS. 9 and 10 of the accompanying drawings. In this fourth embodiment, the motor abnormality detection part 100h performs a determination of abnormality in a motor based on the q-axis target voltage Vq* output from the current control part 100e.

Figure 9:
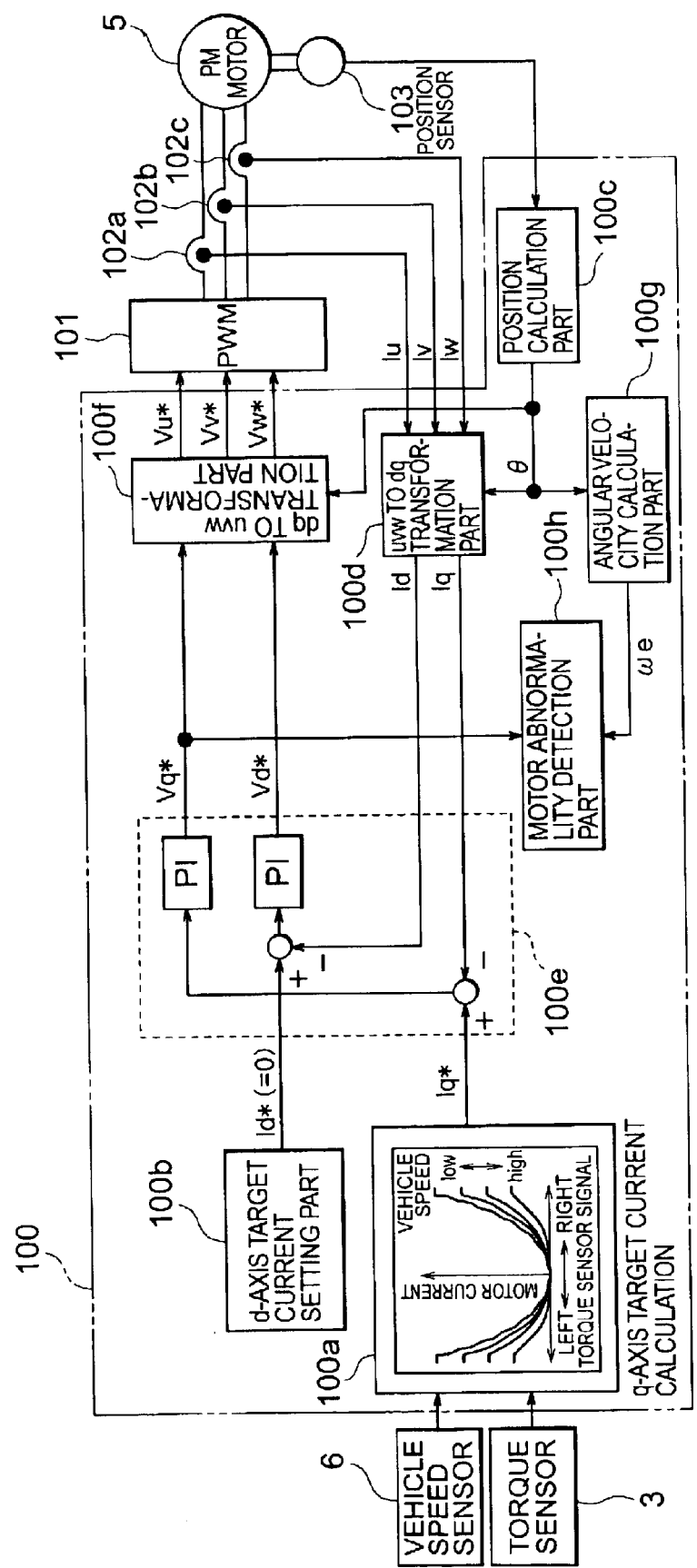
FIG. 9 is a view functionally illustrating an example of an electric power steering control system using a PM brushless motor as a steering assist motor according to a fourth embodiment of the present invention.

FIG. 9 functionally illustrates an example of the electric power steering control apparatus in which a PM brushless motor is used as a steering assist motor, in accordance with the fourth embodiment of the present invention.

Here, note that from expression (3) above, the q-axis armature voltage Vq when the d-axis armature current Id is controlled to zero (i.e., Id=0) is represented by the following expression (6).

$$V_q = R \cdot I_q + \omega_e \cdot \Phi_a \quad (6)$$

Figure 10:
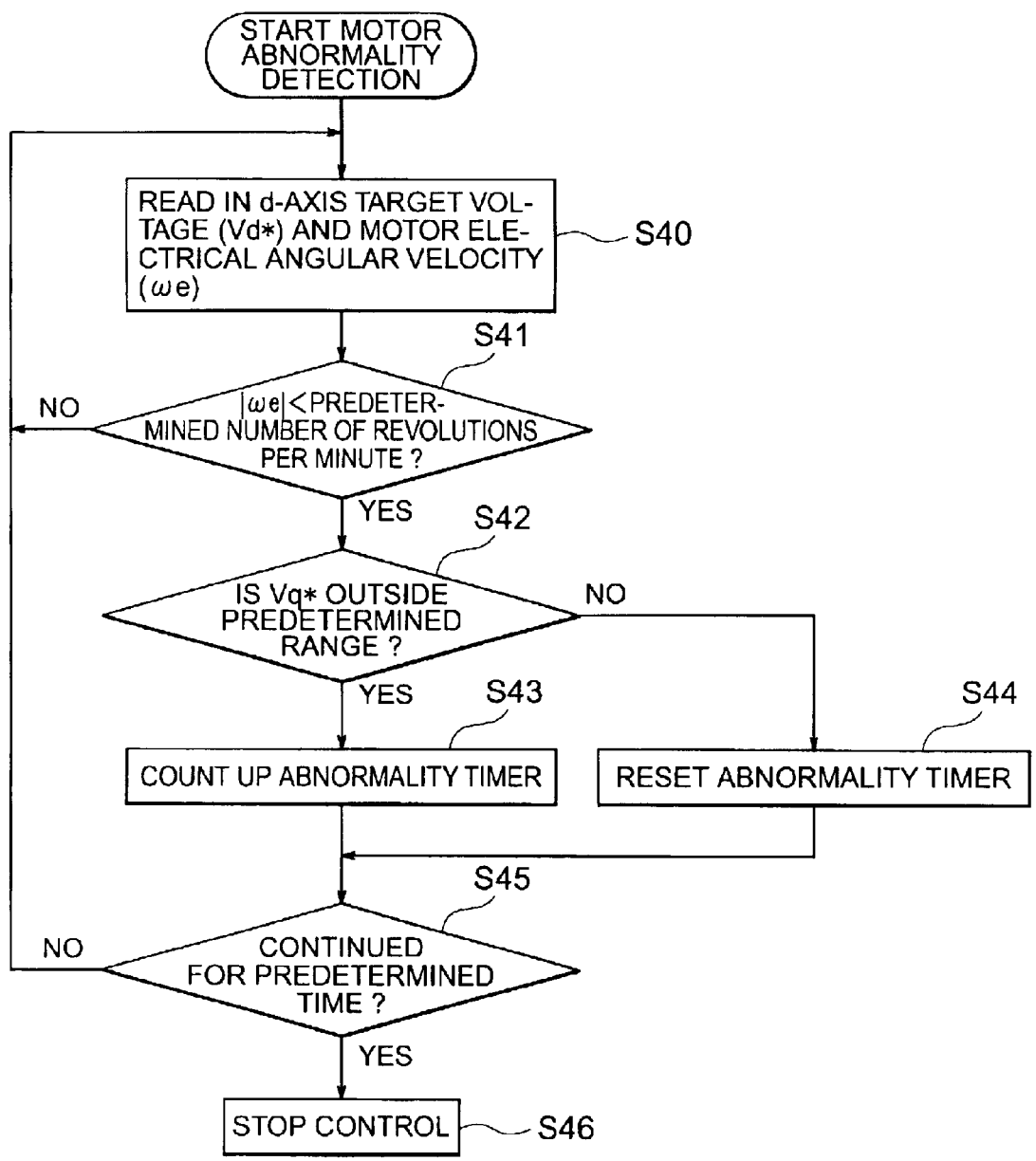
FIG. 10 is used to explain the operation of the fourth embodiment of the present invention, and is a flow chart explaining the processing performed by a motor abnormality detection part 100h of FIG. 9.

FIG. 10 is a flow chart explaining the processing performed by the motor abnormality detection part 100h according to the fourth embodiment. In step S40, the q-axis target voltage Vq* output from the current control part 100e and the motor electrical angular velocity $\omega_e$ output from the angular velocity calculation part 100g are read into the motor abnormality detection part 100h, and then the control flow advances to step S41. In step S41, it is determined whether the motor electrical angular velocity $\omega_e$ is less than a predetermined number of revolutions per minute as set beforehand. When the motor electrical angular velocity $\omega_e$ is less than the predetermined number of revolutions per minute, the control flow proceeds to step S42, whereas when it is equal to or greater than the predetermined number of revolutions per minute, a return to step S40 is performed.

In step S42, it is determined whether the q-axis target voltage Vq* is outside a predetermined range as set beforehand. When the q-axis target voltage Vq* is outside the predetermined range, an abnormality timer is counted up in step S43, whereas when it is within the determination range, the abnormality timer is reset in step S44. Here, in order to prevent mis-detections, the above-mentioned predetermined range as set beforehand is set to be wider than a voltage range into which the q-axis armature voltage Vq, that is obtained from expression (5) above under the condition of the motor electrical angular velocity $\omega_e$ being less than the above-mentioned predetermined number of revolutions pre minute, can fall.

Subsequently, in step S45, it is determined whether an abnormal state continues for a predetermined time, that is, the count value of the abnormality timer has reached a prescribed value. When the count value of the abnormality timer has not yet reached the prescribed value, a return to step S40 is carried out.

When it is determined in step S45, by repeating step S40 through step S45, that the abnormal state continues for the predetermined time, that is, the count value of the abnormality timer has reached the prescribed value, it is assumed that there is abnormality, and the control on the brushless motor 5 is stopped in step S46.

In the electric power steering control system as constructed above in which provision is made for the motor abnormality detection part 100h, abnormality such as a break of a motor power line, a failure of the drive part 101, failures of the current sensors 102a, 102b and 102c, etc., can be detected at all times.

Moreover, since abnormality determination is performed only below the predetermined motor electrical angular velocity, mis-detections can be prevented.

Although in the above-mentioned fourth embodiment, the processing of counting up the abnormality timer is performed when the q-axis target voltage Vq* is outside the predetermined range as set beforehand, the abnormality timer may instead be counted up when the q-axis target voltage Vq* is saturated or reached.

In the fourth embodiment, the detection of motor abnormality in the electric power steering control system has been described, but the present invention can also be used for the detection of abnormality in a motor used in systems or fields other than electric power steering control systems.

Embodiment 5.

Reference will be made to an electric power steering control system in accordance with a fifth embodiment of the present invention while referring to FIGS. 11 and 12 of the accompanying drawings. In this fifth embodiment, the motor abnormality detection part 100h determines that the motor 5 is abnormal when a deviation between the q-axis target voltage Vq* output from the current control part 100e and the q-axis armature voltage Vq obtained from the motor electrical angular velocity $\omega_e$ and the q-axis current Iq using expression (6) above is greater than a prescribed value.

Figure 11:
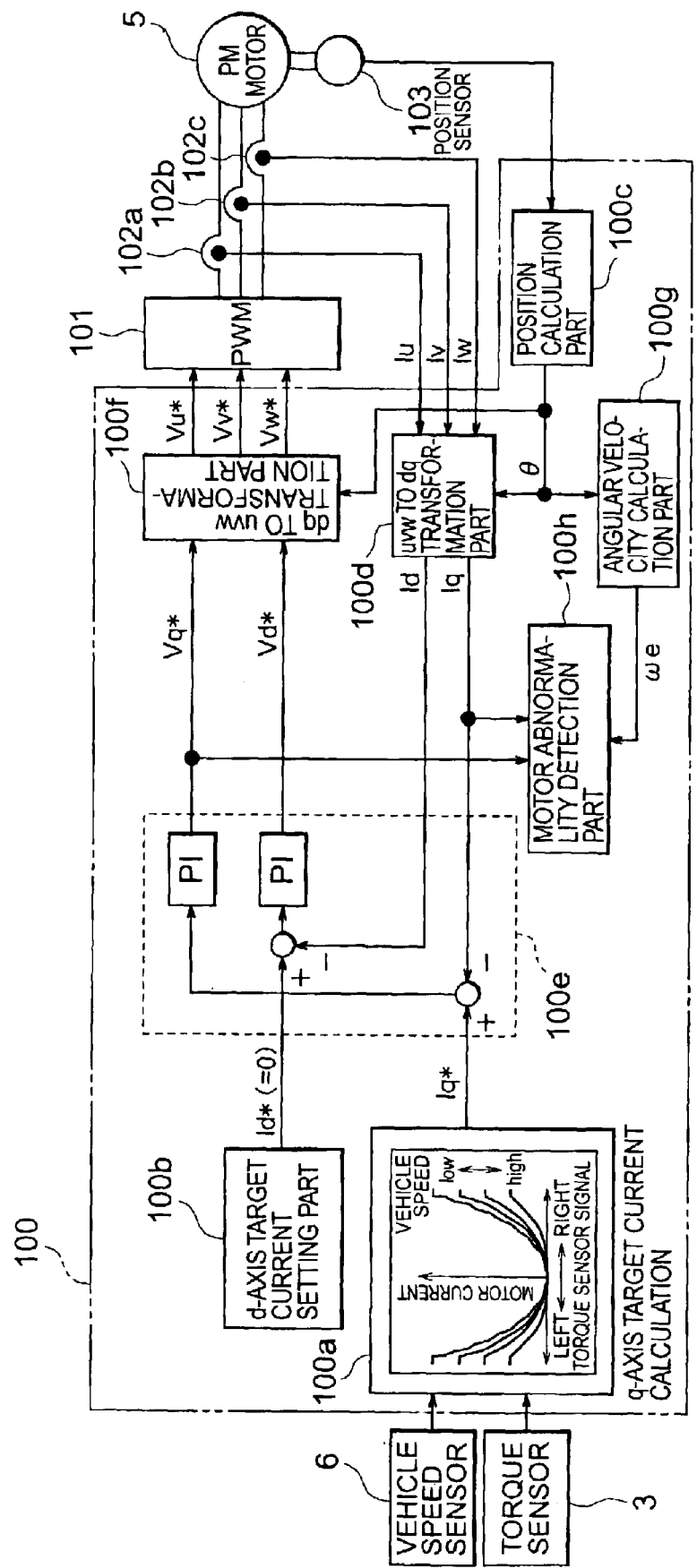
FIG. 11 is a view functionally illustrating an example of an electric power steering control system using a PM brushless motor as a steering assist motor according to a fifth embodiment of the present invention.

FIG. 11 functionally illustrates an example of the electric power steering control apparatus in which a PM brushless motor 5 is used as a steering assist motor, in accordance with the fifth embodiment of the present invention.

Figure 12:
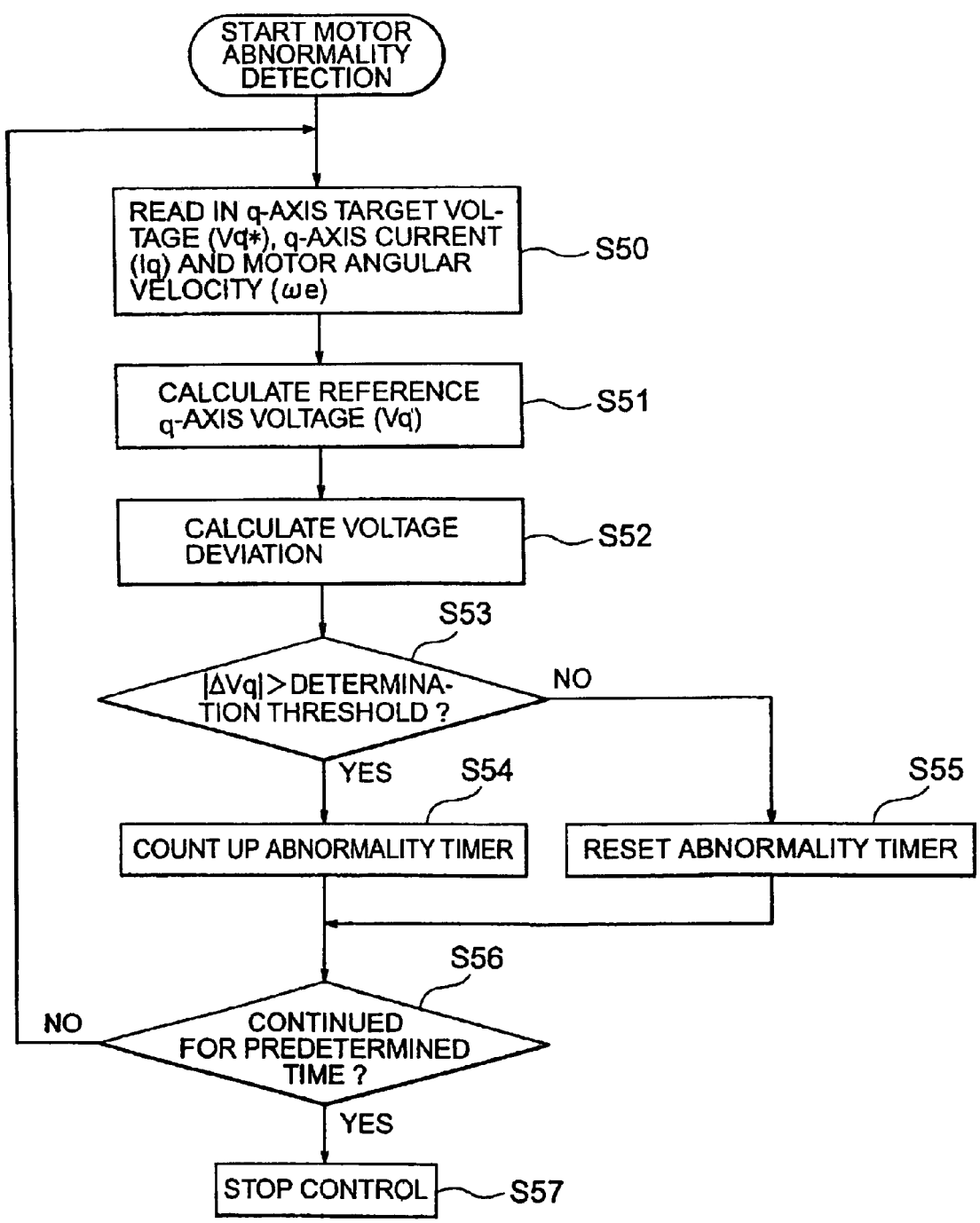
FIG. 12 is used to explain the operation of the fifth embodiment of the present invention, and is a flow chart explaining the processing performed by a motor abnormality detection part 100h of FIG. 11.

FIG. 12 is a flow chart explaining the processing performed by the motor abnormality detection part 100h according to the fifth embodiment. In step S50, the q-axis target voltage Vq* output from the current control part 100e, the motor electrical angular velocity $\omega_e$ output from the angular velocity calculation part 100g and the q-axis current Iq output from the uvw to dq transformation part 100d are read into the motor abnormality detection part 100h, and then the control flow advances to step S51.

In step S51, a q-axis armature voltage Vq that satisfies expression (6) above is calculated by the motor abnormality detection part 100h through arithmetic calculations.

In step S52, a deviation $-\Delta V_q$ between the q-axis target voltage $V_q^*$ output from the current control part 100e and the q-axis armature voltage $V_q$ obtained in step S51 is calculated.

In step S53, it is determined whether the absolute value |ΔVq| of the deviation ΔVq is greater than a determination threshold. When the absolute value |ΔVq| of the deviation ΔVq is greater than the determination threshold, an abnormality timer is counted up in step S54, whereas when it is equal to or less than the determination threshold, the abnormality timer is reset in step S55.

Subsequently, in step S56, it is determined whether an abnormal state continues for a predetermined time, that is, the count value of the abnormality timer has reached a prescribed value. When the count value of the abnormality timer has not yet reached the prescribed value, a return to step S50 is carried out.

When it is determined in step S56, by repeating step S50 through step S56, that the abnormal state continues for the predetermined time, that is, the count value of the abnormality timer has reached the prescribed value, it is assumed that there is abnormality, and the control on the brushless motor 5 is stopped in step S57.

In the electric power steering control system as constructed above in which provision is made for the motor abnormality detection part 100h, abnormality such as a break of a motor power line, a failure of the drive part 101, failures of the current sensors 102a, 102b and 102c, etc., can be detected at all times.

In the fifth embodiment, the detection of motor abnormality in the electric power steering control system has been described, but the present invention can also be used for the detection of abnormality in a motor used in systems or fields other than electric power steering control systems.

In the fifth embodiment, the motor abnormality detection part 100h determines that the motor 5 is abnormal when the deviation between the q-axis target voltage Vq* output from the current control part 100e and the q-axis armature voltage Vq obtained from expression (6) is greater than the prescribed value, but the q-axis armature voltage Vq as shown in the following expression (7) may instead be calculated while taking into consideration the d-axis armature current Id from expression (3) above, and a determination of abnormality in the motor 5 may be made when a deviation between the q-axis armature voltage Vq and the q-axis target voltage Vq* is greater than a prescribed value. This serves to make it possible to perform a more accurate abnormal determination.

$$V_q = \omega_e \cdot L_d \cdot I_d + R \cdot I_q + \omega_e \cdot \Phi_a \qquad (7)$$

where R represents an armature resistance; Id represents a d-axis armature current; $\omega_e$ represents an electrical angular velocity; Lq represents a q-axis inductance; and Iq represents a q-axis armature current.

In this case, it is necessary to input the d-axis current Id from the uvw to dq transformation part 100d to the motor abnormality detection part 100h of FIG. 11.

As described above, according to the present invention, the detection of abnormality in a motor can be performed in an ordinary control state.

In addition, it is possible to obtain an electric power steering control system equipped with such a motor abnormality detection apparatus which is capable of detecting abnormality in a motor that generates an assist force for power steering under an ordinary control state without supplying a current to the motor for the purpose of abnormality detection.

While the invention has been described in terms of preferred embodiments, those skilled in the art will recognize that the invention can be practiced with modifications within the spirit and scope of the appended claims.

What is claimed is:

1. A motor abnormality detection apparatus in which a motor is controlled through vector control which is described by a two-phase rotating magnetic flux coordinate system having the direction of a field current as a d-axis direction and a direction orthogonal to the d-axis direction as a q-axis direction, said apparatus comprising a motor abnormality detection part for making a determination of abnormality in said motor based on target impression voltages impressed on said motor, wherein said motor abnormality detection part performs an abnormality determination of said motor based on a sum of squares of a d-axis target voltage and a q-axis target voltage of the target impression voltages impressed on said motor.

2. The motor abnormality detection apparatus according to claim 1, wherein said motor abnormality detection part determines that said motor is abnormal when the sum of squares of the d-axis target voltage and the q-axis target voltage is equal to or greater than a prescribed value.

3. The motor abnormality detection apparatus according to claim 1, wherein said motor abnormality detection part determines that said motor is abnormal when a synthesized voltage vector of the d-axis target voltage and the q-axis target voltage becomes an operating point on a voltage limiting circle.

4. The motor abnormality detection apparatus according to claim 1, further comprising means for detecting an angular velocity of said motor, wherein said motor abnormality detection part performs the abnormality determination of said motor only when the angular velocity of said motor is below a predetermined number of revolutions per minute.

5. An electric power steering control system equipped with said motor abnormality detection apparatus according to claim 1.

6. A motor abnormality detection apparatus in which a motor is controlled through vector control which is described by a two-phase rotating magnetic flux coordinate system having the direction of a field current as a d-axis direction and a direction orthogonal to the d-axis direction as a q-axis direction, said apparatus comprising an abnormality detection part for making a determination of abnormality in said motor based on target impression voltages impressed on said motor, wherein said motor abnormality detection part makes the abnormality determination of said motor based on a d-axis target voltage of said target impression voltages impressed on said motor, and wherein said motor abnormality detection part determines that said motor is abnormal when said d-axis target voltage is outside a predetermined range that is set beforehand.

7. The motor abnormality detection apparatus according to claim 6, further comprising means for detecting an angular velocity of said motor, wherein said motor abnormality detection part performs the abnormality determination of said motor only when the angular velocity of said motor is below a predetermined number of revolutions per minute.

8. An electric power steering control system equipped with said motor abnormality detection apparatus according to claim 6.

9. A motor abnormality detection apparatus in which a motor is controlled through vector control which is described by a two-phase rotating magnetic flux coordinate system having the direction of a field current as a d-axis direction and a direction orthogonal to the d-axis direction as a q-axis direction, said apparatus comprising an abnormality detection part for making a determination of abnormality in said motor based on target impression voltages impressed on said motor, wherein said motor abnormality detection part makes the abnormality determination of said motor based on a d-axis target voltage of said target impression voltages impressed on said motor, and wherein said motor abnormality detection part determines that said motor is abnormal when said d-axis target voltage is saturated.

10. The motor abnormality detection apparatus according to claim 9, further comprising means for detecting an angular velocity of said motor, wherein said motor abnormality detection part performs the abnormality determination of said motor only when the angular velocity of said motor is below a predetermined number of revolutions per minute.

11. An electric power steering control system equipped with said motor abnormality detection apparatus according to claim 9.

12. A motor abnormality detection apparatus in which a motor is controlled through vector control which is described by a two-phase rotating magnetic flux coordinate system having the direction of a field current as a d-axis direction and a direction orthogonal to the d-axis direction as a q-axis direction, said apparatus comprising an abnormality detection part for making a determination of abnormality in said motor based on target impression voltages impressed on said motor,
wherein said motor abnormality detection part makes the abnormality determination of said motor based on a d-axis target voltage of said target impression voltages impressed on said motor, and
wherein said motor abnormality detection part determines that said motor is abnormal when a deviation between said d-axis target voltage and a d-axis armature voltage which is shown by the following expression is greater than a prescribed value:

$$V_d = R \cdot I_d - \omega_e \cdot L_q \cdot I_q$$

where R represents an armature resistance; $I_d$ represents a d-axis armature current; $\omega_e$ represents an electrical angular velocity; $L_q$ represents a q-axis inductance; and $I_q$ represents a q-axis armature current.

13. The motor abnormality detection apparatus according to claim 12, further comprising means for detecting an angular velocity of said motor, wherein said motor abnormality detection part performs the abnormality determination of said motor only when the angular velocity of said motor is below a predetermined number of revolutions per minute.

14. An electric power steering control system equipped with said motor abnormality detection apparatus according to claim 12.

15. A motor abnormality detection apparatus in which a motor is controlled through vector control which is described by a two-phase rotating magnetic flux coordinate system having the direction of a field current as a d-axis direction and a direction orthogonal to the d-axis direction as a q-axis direction, said apparatus comprising an abnormality detection part for making a determination of abnormality in said motor based on target impression voltages impressed on said motor,
wherein said motor abnormality detection part performs the abnormality determination of said motor based on a q-axis target voltage of said target impression voltages impressed on said motor, and
wherein said motor abnormality detection part determines that said motor is abnormal when said q-axis target voltage is outside a predetermined range that is set beforehand.

16. The motor abnormality detection apparatus according to claim 15, further comprising means for detecting an angular velocity of said motor, wherein said motor abnormality detection part performs the abnormality determination of said motor only when the angular velocity of said motor is below a predetermined number of revolutions per minute.

17. An electric power steering control system equipped with said motor abnormality detection apparatus according to claim 15.

18. A motor abnormality detection apparatus in which a motor is controlled through vector control which is described by a two-phase rotating magnetic flux coordinate system having the direction of a field current as a d-axis direction and a direction orthogonal to the d-axis direction as a q-axis direction, said apparatus comprising an abnormality detection part for making a determination of abnormality in said motor based on target impression voltages impressed on said motor,
wherein said motor abnormality detection part performs the abnormality determination of said motor based on a q-axis target voltage of said target impression voltages impressed on said motor, and
wherein said motor abnormality detection part determines that said motor is abnormal when said q-axis target voltage is saturated.

19. The motor abnormality detection apparatus according to claim 18, further comprising means for detecting an angular velocity of said motor, wherein said motor abnormality detection part performs the abnormality determination of said motor only when the angular velocity of said motor is below a predetermined number of revolutions per minute.

20. An electric power steering control system equipped with said motor abnormality detection apparatus according to claim 18.

21. A motor abnormality detection apparatus in which a motor is controlled through vector control which is described by a two-phase rotating magnetic flux coordinate system having the direction of a field current as a d-axis direction and a direction orthogonal to the d-axis direction as a q-axis direction, said apparatus comprising an abnormality detection part for making a determination of abnormality in said motor based on target impression voltages impressed on said motor,
wherein said motor abnormality detection part performs the abnormality determination of said motor based on a q-axis target voltage of said target impression voltages impressed on said motor, and
wherein said motor abnormality detection part determines that said motor is abnormal when a deviation between said q-axis target voltage and a q-axis armature voltage Vq which is shown by the following expression is greater than a prescribed value:

$$V_q = \omega_e \cdot L_d \cdot I_d + R \cdot I_q + \omega_e \cdot \Phi_a$$

where $\omega_e$ represents an electrical angular velocity; $L_d$ represents a d-axis inductance; $I_d$ represents a d-axis armature current; R represents an armature resistance; $I_q$ represents a q-axis armature current; $\Phi_a$ represents $\sqrt{(3/2)} \cdot \Phi'_a$; and $\Phi'_a$ represents an armature winding interlinkage magnetic flux maximum value.

22. The motor abnormality detection apparatus according to claim 21, further comprising means for detecting an angular velocity of said motor, wherein said motor abnormality detection part performs the abnormality determination of said motor only when the angular velocity of said motor is below a predetermined number of revolutions per minute.

23. An electric power steering control system equipped with said motor abnormality detection apparatus according to claim 21.

24. A motor abnormality detection apparatus in which a motor is controlled through vector control which is described by a two-phase rotating magnetic flux coordinate system having the direction of a field current as a d-axis direction and a direction orthogonal to the d-axis direction as a q-axis direction, said apparatus comprising an abnormality detection part for making a determination of abnormality in said motor based on target impression voltages impressed on said motor, and means for detecting an annular velocity of said motor, wherein said motor abnormality detection part performs the abnormality determination of said motor only when the angular velocity of said motor is below a predetermined number of revolutions per minute, and wherein said motor abnormality detection part uses a steering angular velocity in place of the angular velocity of said motor.

25. A motor abnormality detection apparatus, comprising:
an output circuit that applies target voltages to a motor; and
a control circuit that detects an abnormality of the motor based on at least a target voltage,
wherein the motor is controlled via vector control defined in a coordinate system in which a field current corresponds to a d-axis direction and a q-axis direction is orthogonal to the d-axis direction,
wherein the at least a target voltage comprises a d-axis target voltage and a q-axis target voltage,
wherein the d-axis target voltage is a component of the at least the target voltage in the d-axis direction,
wherein the q-axis target voltage is a component of the at least the target voltage in the q-axis direction, and
wherein the control circuit detects the abnormality based on a sum of squares of a d-axis target voltage and a q-axis target voltage.

26. The apparatus as claimed in claim 25, wherein the coordinate system comprises a two-phase rotating magnetic flux coordinate system.

27. The apparatus as claimed in claim 25, wherein the control circuit detects the abnormality when the sum of squares of the d-axis target voltage and the q-axis target voltage is equal to or greater than a prescribed value.

28. The apparatus as claimed in claim 25, wherein the control circuit detects the abnormality when a synthesized voltage vector of the d-axis target voltage and the q-axis target voltage becomes an operating point on a voltage limiting circle.

29. The apparatus as claimed in claim 25, wherein the control circuit detects an angular velocity of the motor,
wherein the control circuit detects the abnormality only when the angular velocity of the motor is less than a predetermined value.

30. A motor abnormality detection apparatus, comprising:
an output circuit that applies target voltages to a motor; and
a control circuit that detects an abnormality of the motor based on at least a target voltage,
wherein the motor is controlled via vector control defined in a coordinate system in which a field current corresponds to a d-axis direction and a q-axis direction is orthogonal to the d-axis direction,
wherein the at least a target voltage comprises a d-axis target voltage, which is a component of the at least the target voltage in the d-axis direction,
wherein the control circuit detects the abnormality based on the d-axis target voltage, and
wherein the control circuit detects the abnormality when the d-axis target voltage is outside a predetermined range.

31. The apparatus as claimed in claim 30, wherein the control circuit detects an angular velocity of the motor,
wherein the control circuit detects the abnormality only when the angular velocity of the motor is less than a predetermined value.

32. A motor abnormality detection apparatus, comprising:
an output circuit that applies target voltages to a motor; and
a control circuit that detects an abnormality of the motor based on at least a target voltage,
wherein the motor is controlled via vector control defined in a coordinate system in which a field current corresponds to a d-axis direction and a q-axis direction is orthogonal to the d-axis direction,
wherein the at least a target voltage comprises a d-axis target voltage, which is a component of the at least the target voltage in the d-axis direction,
wherein the control circuit detects the abnormality based on the d-axis target voltage, and
wherein the control circuit detects the abnormality when the d-axis target voltage is saturated.

33. The apparatus as claimed in claim 32, wherein the control circuit detects an angular velocity of the motor,
wherein the control circuit detects the abnormality only when the angular velocity of the motor is less than a predetermined value.

34. A motor abnormality detection apparatus, comprising:
an output circuit that applies target voltages to a motor; and
a control circuit that detects an abnormality of the motor based on at least a target voltage,
wherein the motor is controlled via vector control defined in a coordinate system in which a field current corresponds to a d-axis direction and a q-axis direction is orthogonal to the d-axis direction,
wherein the at least a target voltage comprises a d-axis target voltage, which is a component of the at least the target voltage in the d-axis direction,
wherein the control circuit detects the abnormality based on the d-axis target voltage, and
wherein the control circuit detects the abnormality when a deviation between said d-axis target voltage and a d-axis armature voltage is greater than a predetermined value,
wherein the d-axis armature voltage is shown by the following expression:

$$V_d = R \cdot I_d - \omega_e \cdot L_q \cdot I_q$$

wherein R represents an armature resistance, $I_d$ represents a d-axis armature current, $\omega_e$ represents an electrical angular velocity, $L_q$ represents a q-axis inductance, and $I_q$ represents a q-axis armature current.

35. The apparatus as claimed in claim 34, wherein the control circuit detects an angular velocity of the motor,
wherein the control circuit detects the abnormality only when the angular velocity of the motor is less than a predetermined value.

36. A motor abnormality detection apparatus, comprising:
an output circuit that applies target voltages to a motor; and
a control circuit that detects an abnormality of the motor based on at least a target voltage,
wherein the motor is controlled via vector control defined in a coordinate system in which a field current corresponds to a d-axis direction and a q-axis direction is orthogonal to the d-axis direction, wherein the at least a target voltage comprises a q-axis target voltage, which is a component of the at least the target voltage in the q-axis direction, wherein the control circuit detects the abnormality based on a q-axis target voltage, and wherein the control circuit detects the abnormality when the q-axis target voltage is outside a predetermined range.

37. The apparatus as claimed in claim 36, wherein the control circuit detects an angular velocity of the motor, wherein the control circuit detects the abnormality only when the angular velocity of the motor is less than a predetermined value.

38. A motor abnormality detection apparatus, comprising:

an output circuit that applies target voltages to a motor; and a control circuit that detects an abnormality of the motor based on at least a target voltage, wherein the motor is controlled via vector control defined in a coordinate system in which a field current corresponds to a d-axis direction and a q-axis direction is orthogonal to the d-axis direction, wherein the at least a target voltage comprises a q-axis target voltage, which is a component of the at least the target voltage in the q-axis direction, wherein the control circuit detects the abnormality based on a q-axis target voltage, and wherein the control circuit detects the abnormality when the q-axis target voltage is saturated.

39. The apparatus as claimed in claim 38, wherein the control circuit detects an angular velocity of the motor, wherein the control circuit detects the abnormality only when the angular velocity of the motor is less than a predetermined value.

40. A motor abnormality detection apparatus, comprising:

an output circuit that applies target voltages to a motor; and a control circuit that detects an abnormality of the motor based on at least a target voltage, wherein the motor is controlled via vector control defined in a coordinate system in which a field current corresponds to a d-axis direction and a q-axis direction is orthogonal to the d-axis direction, wherein the at least a target voltage comprises a q-axis target voltage, which is a component of the at least the target voltage in the q-axis direction, wherein the control circuit detects the abnormality based on a q-axis target voltage, and wherein the control circuit detects the abnormality when a deviation between the q-axis target voltage and a q-axis armature voltage Vq is greater than a prescribed value, wherein the q-axis armature voltage is shown by the following expression:

$$V_q = \omega_e \cdot L_d \cdot I_d + R \cdot I_q + \omega_e \cdot \Phi_a$$

wherein $\omega_e$ represents an electrical angular velocity, $L_d$ represents a d-axis inductance, $I_d$ represents a d-axis armature current, R represents an armature resistance, $I_q$ represents a q-axis armature current, $\Phi_a$ represents $\sqrt{(3/2)} \cdot \Phi'_a$, and $\Phi'_a$ represents an armature winding interlinkage magnetic flux maximum value.

41. The apparatus as claimed in claim 40, wherein the control circuit detects an angular velocity of the motor, wherein the control circuit detects the abnormality only when the angular velocity of the motor is less than a predetermined value.

* * * * *